United States Patent
Uchiyama

(10) Patent No.: US 12,067,336 B2
(45) Date of Patent: Aug. 20, 2024

(54) INFORMATION PROCESSING APPARATUS, NON-TRANSITORY COMPUTER READABLE MEDIUM, AND PROGRAMMABLE LOGIC CIRCUIT

(71) Applicant: FUJIFILM Business Innovation Corp., Tokyo (JP)

(72) Inventor: Junichi Uchiyama, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 366 days.

(21) Appl. No.: 17/324,087

(22) Filed: May 18, 2021

(65) Prior Publication Data

US 2022/0108057 A1  Apr. 7, 2022

(30) Foreign Application Priority Data

Oct. 1, 2020 (JP) ................. 2020-167339

(51) Int. Cl.
*G06F 30/34* (2020.01)
(52) U.S. Cl.
CPC .................... *G06F 30/34* (2020.01)
(58) Field of Classification Search
USPC ........................................... 716/117
See application file for complete search history.

(56) References Cited

U.S. PATENT DOCUMENTS

| | | | |
|---|---|---|---|
| 8,719,550 B2 | 5/2014 | Naito et al. | |
| 9,560,164 B2 * | 1/2017 | Shinto | H04L 67/34 |
| 2002/0010853 A1 * | 1/2002 | Trimberger | H03K 19/1776 713/1 |
| 2010/0058274 A1 * | 3/2010 | Pike | H04L 45/60 716/128 |
| 2016/0342722 A1 * | 11/2016 | Sentieys | G06F 15/7871 |
| 2019/0012116 A1 * | 1/2019 | Gutala | G06F 3/0632 |
| 2022/0108057 A1 * | 4/2022 | Uchiyama | G06F 30/34 |

FOREIGN PATENT DOCUMENTS

| | | |
|---|---|---|
| JP | 2001320271 | 11/2001 |
| JP | 2011199640 | 10/2011 |
| JP | 2011203920 | 10/2011 |
| JP | 2015149025 | 8/2015 |
| JP | 2016-170629 | 9/2016 |

OTHER PUBLICATIONS

"Office Action of Japan Counterpart Application", issued on Jun. 18, 2024, with English translation thereof, p. 1-p. 8.

* cited by examiner

*Primary Examiner* — Mohammed Alam
(74) *Attorney, Agent, or Firm* — JCIPRNET

(57) ABSTRACT

An information processing apparatus includes a processor configured to: acquire multiple pieces of circuit configuration information corresponding to multiple split circuits forming a processing circuit configured to execute a single processing function; and cause reconfiguration processes that reconfigure multiple partial reconfiguration regions into the multiple split circuits corresponding to the multiple pieces of acquired circuit configuration information to be executed in parallel.

19 Claims, 10 Drawing Sheets

INFORMATION PROCESSING APPARATUS, NON-TRANSITORY COMPUTER READABLE MEDIUM, AND PROGRAMMABLE LOGIC CIRCUIT

CROSS-REFERENCE TO RELATED APPLICATIONS

This application is based on and claims priority under 35 USC 119 from Japanese Patent Application No. 2020-167339 filed Oct. 1, 2020.

BACKGROUND

(i) Technical Field

The present disclosure relates to an information processing apparatus, a non-transitory computer readable medium, and a programmable logic circuit.

(ii) Related Art

Japanese Unexamined Patent Application Publication No. 2015-149025 discloses an image processing apparatus provided with a dynamic partial reconfiguration unit configured to reconfigure an internal circuit configuration dynamically and partially, and a reconfiguration controller configured to control the reconfiguration of the circuit configuration by the dynamic partial reconfiguration unit. One or multiple processing circuits configured by the dynamic partial reconfiguration unit each include a data processing unit and a parameter storage unit that stores parameters used in processing by the data processing unit. A circuit configuration corresponding to parameters according to settings in the processing by the data processing unit is defined for the parameter storage unit, and the reconfiguration controller reconfigures only the circuit configuration of the parameter storage unit according to a change of settings in the processing by the data processing unit.

Japanese Unexamined Patent Application Publication No. 2001-320271 discloses a method of reconfiguring multiple circuits in a programmable logic circuit in a case where processing is executed successively in parallel by the reconfigured circuits while also successively reconfiguring the multiple circuits. For a circuit in which a previous circuit that has been reconfigured previously and is executing processing exists in at least a portion of a region where the circuit is to be reconfigured next, data for reconfiguration is split into an overlapping portion and a non-overlapping portion with respect to the region of the previous circuit, the non-overlapping portion is reconfigured in parallel with the processing by the previous circuit, and after the processing by the previous circuit ends, the overlapping portion is reconfigured.

Japanese Unexamined Patent Application Publication No. 2016-170629 discloses an image processing apparatus including a reconfigurable circuit that is reconfigurable in predetermined units of reconfiguration by rewriting circuit configuration data stored in a configuration memory. The image processing apparatus is provided with: storage that stores circuit configuration data corresponding to a circuit to be reconfigured in a reconfiguration region for each reconfiguration region to be reconfigured; a combiner that, in a case where the unit of reconfiguration contains multiple reconfiguration regions, combines rewrite data including the circuit configuration data corresponding to the circuit to be configured in each of the reconfiguration regions; and a rewriter that rewrites the circuit configuration data in the configuration memory with the rewrite data combined by the combiner in the units of reconfiguration.

SUMMARY

In a semiconductor device such as a field-programmable gate array (FPGA) in which processing functions are switchable by reconfiguring a circuit in a reconfiguration region, when switching from a first processing function to a second processing function, the circuit in the reconfiguration region is reconfigured to enable execution of the second processing function.

For this reason, the semiconductor device is unable to execute processing according to the second processing function while the circuit for the second processing function is being reconfigured in the reconfiguration region.

Aspects of non-limiting embodiments of the present disclosure relate to shortening the duration of reconfiguration associated with a processing function compared to the case of reconfiguring a circuit that executes a single processing function only in a single reconfiguration region.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided an information processing apparatus including a processor configured to: acquire multiple pieces of circuit configuration information corresponding to multiple split circuits forming a processing circuit configured to execute a single processing function; and cause reconfiguration processes that reconfigure multiple partial reconfiguration regions into the multiple split circuits corresponding to the multiple pieces of acquired circuit configuration information to be executed in parallel.

BRIEF DESCRIPTION OF THE DRAWINGS

Exemplary embodiments of the present disclosure will be described in detail based on the following figures, wherein.

DETAILED DESCRIPTION

Hereinafter, exemplary embodiments for carrying out the present disclosure will be described in detail and with reference to the drawings.

First Exemplary Embodiment

Figure 1:
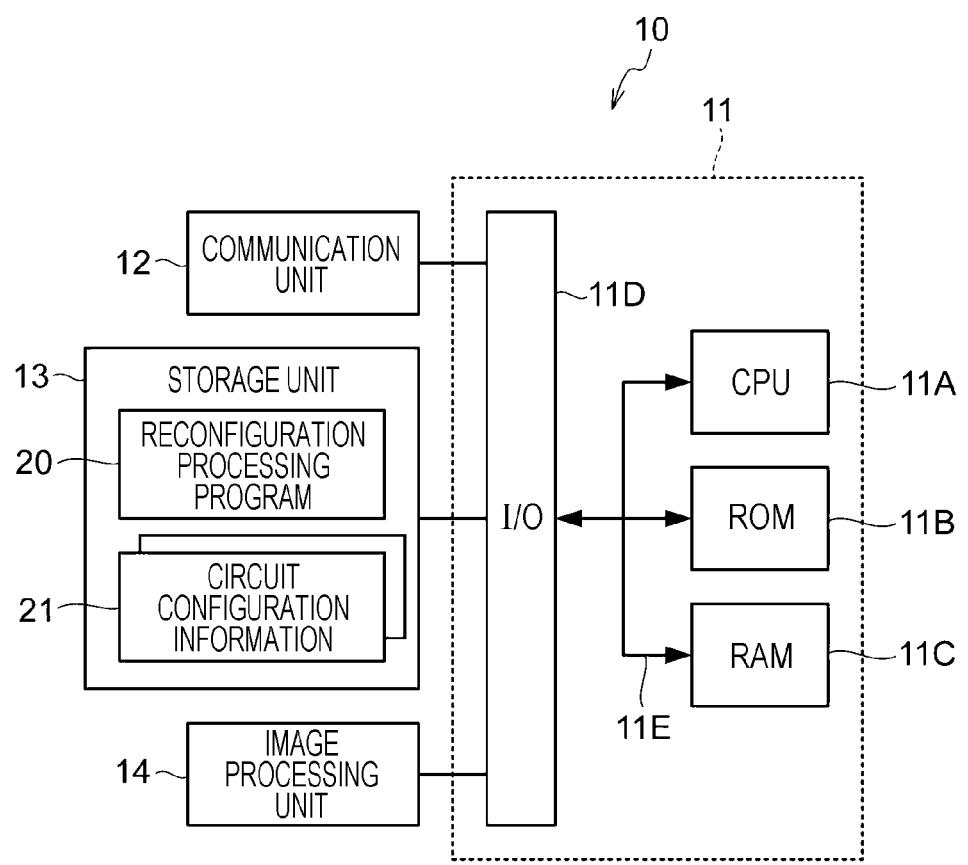
FIG. 1 is a configuration diagram of an image processing apparatus.

FIG. 1 is a diagram illustrating a configuration diagram of an image processing apparatus 10 according to the present exemplary embodiment. The image processing apparatus 10 is provided with functions such as a scan function, a copy function, a print function, and a facsimile function, for example, and is applied to a multi-function device that performs various types of image processing, but is not limited thereto. Note that the image processing apparatus 10 is one example of an information processing apparatus.

As illustrated in FIG. 1, the image processing apparatus 10 is provided with a controller 11. The controller 11 is provided with a central processing unit (CPU) 11A, read-only memory (ROM) 11B, random access memory (RAN) 11C, and an input/output interface (I/O) 11D. Additionally, the CPU 11A, the ROM 11B, the RAM 11C, and the I/O 11D are interconnected through a system bus 11E. The system bus 11E includes a control bus, an address bus, and a data bus. Note that the CPU 11A is an example of a processor.

Additionally, a communication unit 12, a storage unit 13, and an image processing unit 14 are connected to the I/O 11D.

The communication unit 12 is an interface for data communication with a higher-layer device not illustrated.

The storage unit 13 is a non-volatile external storage device such as a hard disk, and stores information such as a reconfiguration processing program 20 and circuit configuration information 21 described later. The CPU 11A loads the reconfiguration processing program 20 stored in the storage unit 13 into the RAM 11C, and executes the reconfiguration processing program 20. Note that the reconfiguration processing program 20 is one example of an information processing program.

The image processing unit 14 is a programmable logic circuit that switches among multiple types of image processing to execute by reconfiguring the circuit, and is configured as a field-programmable gate array (FPGA) as one example in the present exemplary embodiment.

Figure 2:
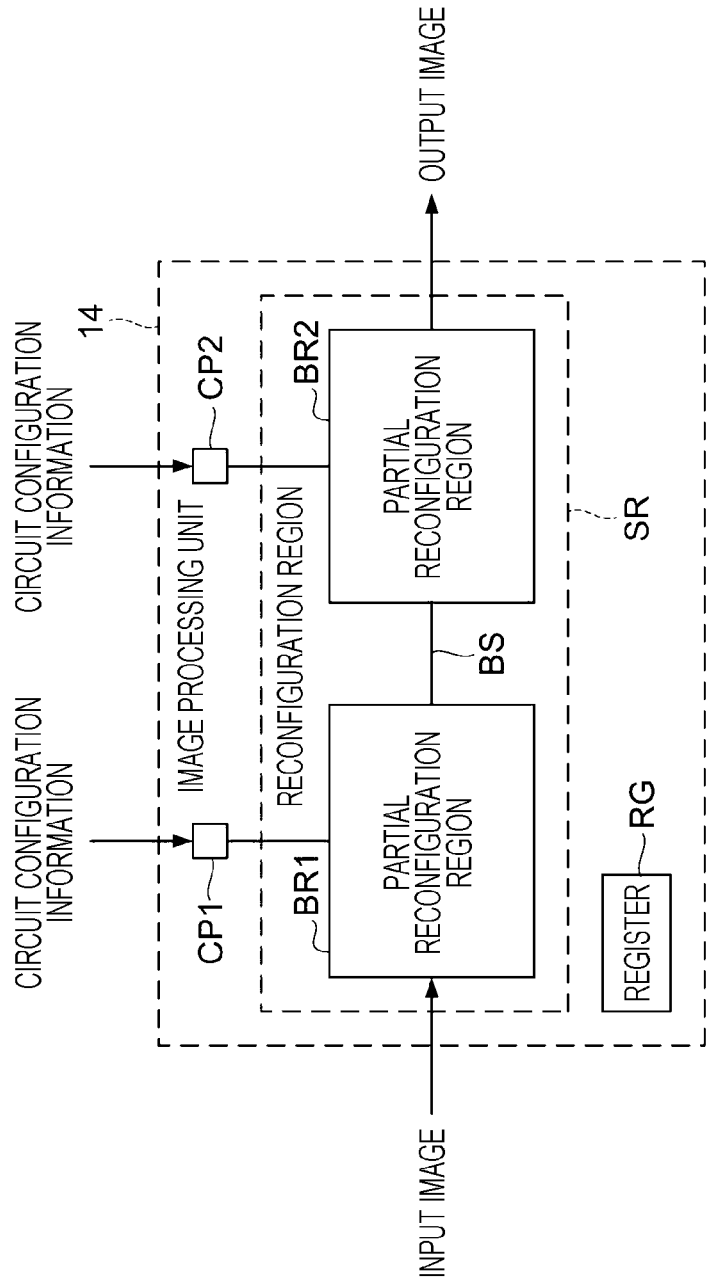
FIG. 2 is a configuration diagram of an image processing unit.

As illustrated in FIG. 2, the image processing unit 14 is provided with a reconfiguration region SR. The reconfiguration region SR is pre-divided into partial reconfiguration regions BR1 and BR2. The partial reconfiguration regions BR1 and BR2 are connected in series through a bus BS. Note that although the present exemplary embodiment describes a case in which the reconfiguration region SR is pre-divided into the two partial reconfiguration regions BR1 and BR2 as an example, the reconfiguration region SR may also be divided into three or more partial reconfiguration regions. Hereinafter, the partial reconfiguration regions BR1 and BR2 may be referred to as the partial reconfiguration region(s) BR in some cases when not being particularly distinguished. Note that the partial reconfiguration region BR1 is one example of a first partial reconfiguration region, and the partial reconfiguration region BR2 is one example of a second partial reconfiguration region.

A configuration port CP1 is connected to the partial reconfiguration region BR1. By inputting circuit configuration information into the configuration port CP1, the partial reconfiguration region BR1 is reconfigured into a circuit corresponding to the inputted circuit configuration information. Similarly, a configuration port CP2 is connected to the partial reconfiguration region BR2. By inputting circuit configuration information into the configuration port CP2, the partial reconfiguration region BR2 is reconfigured into a circuit corresponding to the inputted circuit configuration information. Note that hereinafter, the configuration ports CP1 and CP2 may be referred to as the configuration port(s) CP in some cases when not being particularly distinguished.

Note that in the case of causing no processing to be executed in one of the circuits reconfigured in the partial reconfiguration regions BR1 and BR2, a setting value corresponding to the circuit where no processing is to be executed is set in a register RG for example. With this arrangement, even in the case where circuits are reconfigured in both of the partial reconfiguration regions BR1 and BR2, if it is desirable not to execute any processing in the circuit reconfigured in the partial reconfiguration region BR2 for example, the setting value corresponding to the partial reconfiguration region BR2 may be set in the register RG, thereby causing processing to be executed only in the circuit reconfigured in the partial reconfiguration region BR1. Consequently, the circuit reconfigured in the partial reconfiguration region BR2 does not perform any processing on data that is processed by the circuit reconfigured in the partial reconfiguration region BR1, and simply outputs the data as-is.

Here, the circuit configuration information includes connection information related to properties such as connections between multiple logic blocks included in the partial reconfiguration region BR, and parameter information related to image processing settings.

The duration of the reconfiguration of the partial reconfiguration region BR is determined by the reconfiguration time taken to reconfigure a circuit by connecting logic blocks on the basis of the connection information in the circuit configuration information, and by the setting time taken to set various settings in the reconfigured circuit on the basis of the parameter information. Also, the duration of the reconfiguration of the partial reconfiguration region BR is substantially proportional to the circuit scale. Here, the circuit scale is determined by properties such as the number of resource circuits included in the partial reconfiguration region BR, for example. Also, a resource circuit refers to a circuit that achieves a basic function used to achieve a processing function in a reconfigured circuit. Examples of resource circuits include general-purpose logic circuits, memories, and digital signal processor (DSP) circuits, but are not limited to the above.

In the present exemplary embodiment, a case in which the image processing unit 14 successively switches among and executes different types of image processing A, B, and C will be described as an example.

Also, a processing circuit A that executes the image processing A as one example of a first processing function is assumed to include two split circuits A1 and A2, and the storage unit 13 is assumed to store circuit configuration information 21A1 corresponding to the split circuit A1 and circuit configuration information 21A2 corresponding to the split circuit A2.

Also, a processing circuit B that executes the image processing B to be executed next after the image processing A executed by the processing circuit A is assumed to include a circuit of approximately half the circuit scale of the processing circuits A and C, and the storage unit 13 is assumed to store circuit configuration information 21B corresponding to the processing circuit B. Note that the image processing B is one example of first subsequent processing, and the processing circuit B is one example of a first subsequent processing circuit.

Also, a processing circuit C that executes the image processing C to be processed next after the image processing B is assumed to include two split circuits C1 and C2, and the storage unit 13 is assumed to store circuit configuration information 21C1 corresponding to the split circuit C1 and circuit configuration information 21C2 corresponding to the split circuit C2. Note that the image processing C is one example of second subsequent processing, and the processing circuit C is one example of a second subsequent processing circuit. Note that in the following, the circuit configuration information 21A1, 21A2, 21B, 21C1, and 21C2 may be referred to as the circuit configuration information 21 in some cases when not being particularly distinguished.

Figure 3:
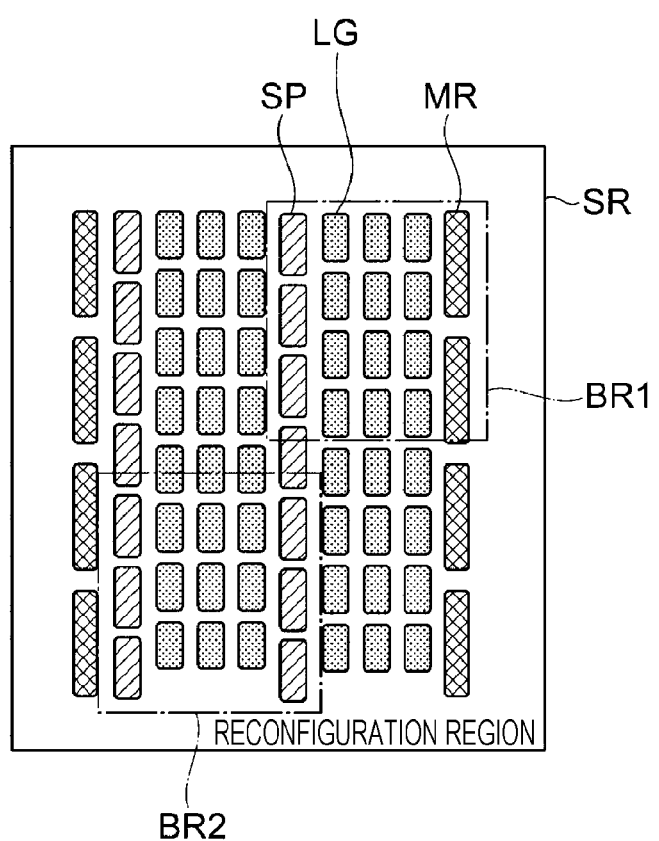
FIG. 3 is a configuration diagram of a reconfiguration region.

Here, as illustrated in FIG. 3 for example, resource circuits such as general-purpose logic circuits LG, memories MR, and signal processing circuits SP typically are arranged in a matrix in an FPGA, but the resource circuits are not necessarily arranged uniformly. For this reason, even if the partial reconfiguration regions BR1 and BR2 are the same size (area) as illustrated in FIG. 3 for example, the types and numbers of included resource circuits are different depending on the location.

Also, because the image processing A to C demand different types and numbers of resource circuits, each of the partial reconfiguration regions BR1 and BR2 includes the maximum number of resource circuits for each type of resource circuit included in the multiple circuits that have a possibility of being reconfigured in the partial reconfiguration regions BR1 and BR2. Also, the numbers of resource circuits included in each of the partial reconfiguration regions BR1 and BR2 are preferably substantially the same. Here, the number of resource circuits being substantially the same is not limited to the case where the numbers of resource circuits are equal, and also includes cases where the difference between the numbers of resource circuits is a threshold value (for example, a few) or less.

In the present exemplary embodiment, the circuits that have a possibility of being reconfigured in the partial reconfiguration regions BR1 and BR2 are the split circuits A1 and A2, the processing circuit B, and the split circuits C1 and C2, and therefore the partial reconfiguration regions BR1 and BR2 are set to include the maximum number of resource circuits for each type of resource circuit included in these circuits.

For example, assume that the resource circuits demanded by the split circuit A1 are ten general-purpose logic circuits, two memories, and three DSPs, while the resource circuits demanded by the split circuit A2 are 11 general-purpose logic circuits, two memories, and two DSPs.

Also, assume that the resource circuits demanded by the processing circuit B are five general-purpose logic circuits, one memory, and two DSPs.

Also, assume that the resource circuits demanded by the split circuit C1 are nine general-purpose logic circuits, three memories, and two DSPs, while the resource circuits demanded by the split circuit C2 are nine general-purpose logic circuits, four memories, and one DSP.

Furthermore, assume that the circuits that have a possibility of being reconfigured in the partial reconfiguration region BR1 are the split circuit A1, the processing circuit B, and the split circuit C1, while the circuits that have a possibility of being reconfigured in the partial reconfiguration region BR2 are the split circuit A2 and the split circuit C2.

In this case, the number of general-purpose logic circuits LG demanded in the partial reconfiguration region BR1 is the maximum demanded number of ten general-purpose logic circuits LG from among the split circuit A1, the processing circuit B, and the split circuit C1.

Also, the number of memories MR demanded in the partial reconfiguration region BR1 is the maximum demanded number of three memories MR from among the split circuit A1, the processing circuit B, and the split circuit C1.

Also, the number of signal processing circuits SP demanded in the partial reconfiguration region BR1 is the maximum demanded number of three signal processing circuits SP from among the split circuit A1, the processing circuit B, and the split circuit C1.

Similarly, the number of general-purpose logic circuits LG demanded in the partial reconfiguration region BR2 is the maximum demanded number of 11 general-purpose logic circuits LG from among the split circuit A2 and the split circuit C2.

Also, the number of memories MR demanded in the partial reconfiguration region BR2 is the maximum demanded number of four memories MR from among the split circuit A2 and the split circuit C2.

Also, the number of signal processing circuits SP demanded in the partial reconfiguration region BR2 is the maximum demanded number of two signal processing circuits SP from among the split circuit A2 and the split circuit C2.

In this way, the number of resource circuits included in the partial reconfiguration region BR1 is 16, the number of resource circuits included in the partial reconfiguration region BR2 is 17, and the difference is 1. Consequently, the reconfiguration times of the partial reconfiguration regions BR1 and BR2 are substantially the same.

Additionally, the bus width of the bus BS connecting the partial reconfiguration regions BR1 and BR2 is the maximum bus width from among the bus widths demanded by the multiple circuits that have a possibility of being reconfigured in the partial reconfiguration regions BR1 and BR2.

For example, in the case of reconfiguring a processing circuit in the single, non-split reconfiguration region SR like the related art, the bus that connects the multiple split circuits inside the processing circuit is also reconfigured, and therefore it is sufficient to set the bus width freely. For example, in the case where the bus that connects the split circuits A1 and A2 forming the processing circuit A has a bus width of 16 bits, the bus width of the bus that connects the split circuits C1 and C2 forming the processing circuit C does not have to be set to the same 16-bit width as the processing circuit A, and may be set to 64 bits, for example.

However, because the bus width of the bus BS connecting the partial reconfiguration regions BR1 and BR2 is not reconfigured, the bus width is set to the maximum bus width from among the bus widths demanded by the multiple circuits that have a possibility of being reconfigured in the partial reconfiguration regions BR1 and BR2.

For this reason, in the case where a 16-bit bus width is demanded for the bus BS that connects the split circuits A1 and A2, and a 64-bit bus width is demanded for the bus BS that connects the split circuits C1 and C2, the bus width of the bus BS is set to 64 bits.

Figure 4:
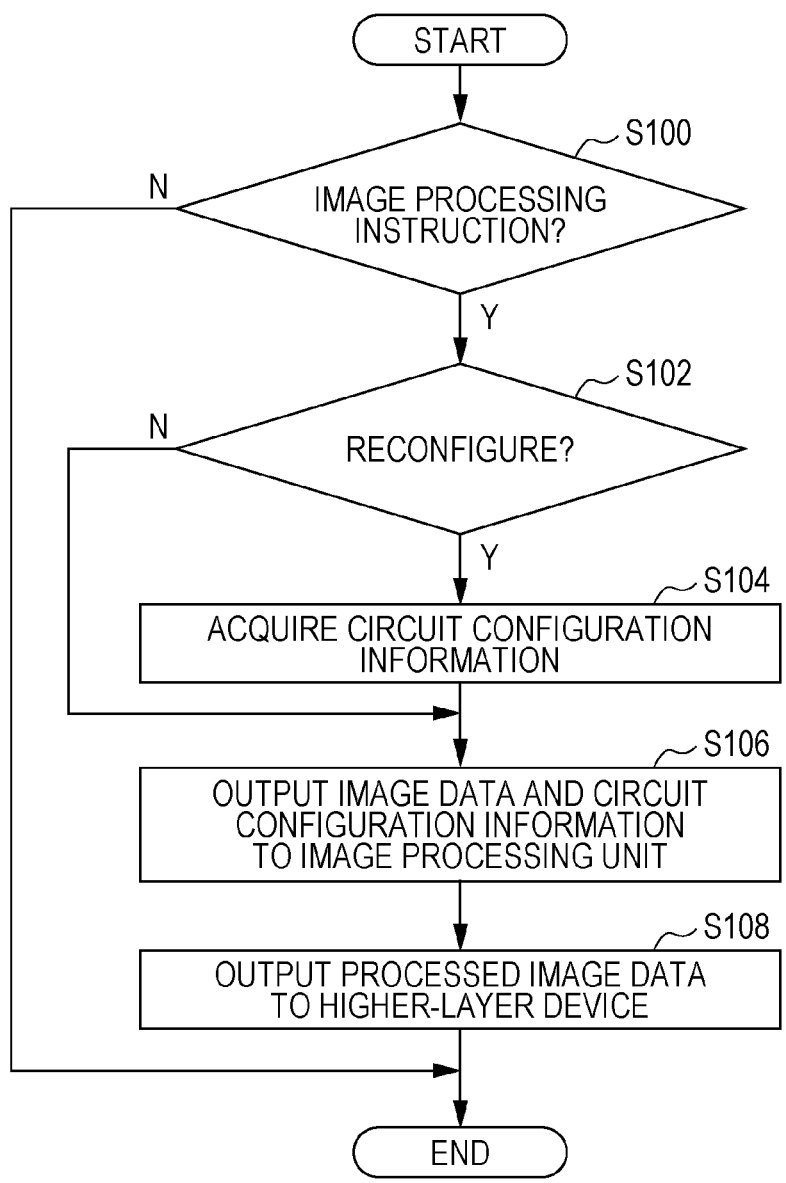
FIG. 4 is a flowchart of a reconfiguration process according to a first exemplary embodiment.

Next, FIG. 4 will be referenced to describe the action of the image processing apparatus 10 according to the present exemplary embodiment. The reconfiguration process illustrated in FIG. 4 is executed by causing the CPU 11A to execute the reconfiguration processing program 20. Note that the reconfiguration process illustrated in FIG. 4 is executed repeatedly at predetermined times.

In step S100, the CPU 11A determines whether or not an instruction to execute any of the image processing A to C has been received together with image data from a higher-layer device not illustrated. In the case where an image processing instruction has been given, the flow proceeds to step S102, whereas if an image processing instruction has not been given, the routine ends.

In step S102, the CPU 11A determines whether or not to reconfigure a circuit in at least one of the partial reconfiguration regions BR1 and BR2. In the case of reconfiguration, the flow proceeds to step S104. On the other hand, in the case where reconfiguration is unnecessary, that is, in the case where a circuit corresponding to the image processing designated by the higher-layer device already exists in at least one of the partial reconfiguration regions BR1 and BR2, the flow proceeds to step S106.

In step S104, the CPU 11A acquires the circuit configuration information 21 of the circuit to be reconfigured by reading out from the storage unit 13.

In step S106, the CPU 11A outputs the image data received in step S100 to the image processing unit 14, and also outputs the circuit configuration information 21 acquired in step S104 to the configuration port CP. With this arrangement, the circuit according to the circuit configuration information 21 is reconfigured in the partial reconfiguration region BR, and the image processing is executed. Additionally, if necessary, the CPU 11A sets setting values in the register RG to cause reconfigured circuits in the partial reconfiguration regions BR1 and BR2 not to execute processing.

In step S108, the CPU 11A receives processed image data from the image processing unit 14, and outputs to the higher-layer device.

Hereinafter, a specific example of reconfiguration in the reconfiguration region SR will be described.

First, in the case where an instruction to execute the image processing A is received together with image data from the higher-layer device (step S100), the CPU 11A acquires the circuit configuration information 21A1 and 21A2 corresponding to the split circuits A1 and A2 forming the processing circuit A from the storage unit 13 (step S104).

Additionally, the CPU 11A outputs the acquired image data to the partial reconfiguration region BR1, and also outputs the circuit configuration information 21A1 and 21A2 to the configuration ports CP1 and CP2 in parallel (step S106). In the image processing unit 14, reconfiguration processing that reconfigures the partial reconfiguration regions BR1 and BR2 into the split circuits A1 and A2 is executed in parallel.

Figure 5:
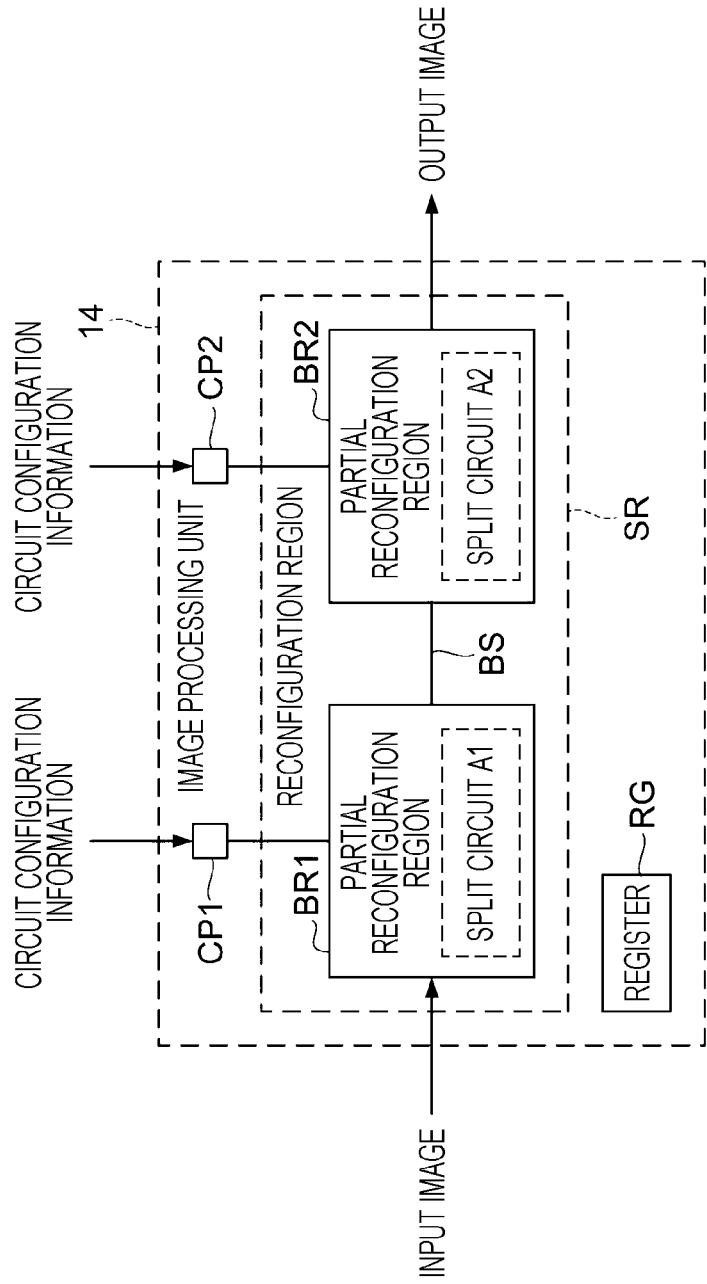
FIG. 5 is a diagram illustrating a state in which a circuit is reconfigured in a reconfiguration region.

With this arrangement, as illustrated in FIG. 5, the image processing unit 14 functions as the processing circuit A including the split circuits A1 and A2, and executes the image processing A on the inputted image data.

Next, in the case where an instruction to execute the image processing B is received together with image data from the higher-layer device (step S100), the CPU 11A acquires the circuit configuration information 21B corresponding to the processing circuit B and the circuit configuration information 21C2 corresponding to the split circuit C2 forming the processing circuit C from the storage unit 13 (step S104).

Additionally, the CPU 11A outputs the acquired circuit configuration information 21B and 21C2 to the configuration ports CP1 and CP2 in parallel (step S106). In the image processing unit 14, reconfiguration processing that reconfigures the partial reconfiguration regions BR1 and BR2 into the processing circuit B and the split circuit C2 is executed in parallel. Additionally, the CPU 11A sets setting values in the register RG to cause the split circuit C2 not to execute any processing.

Figure 6:
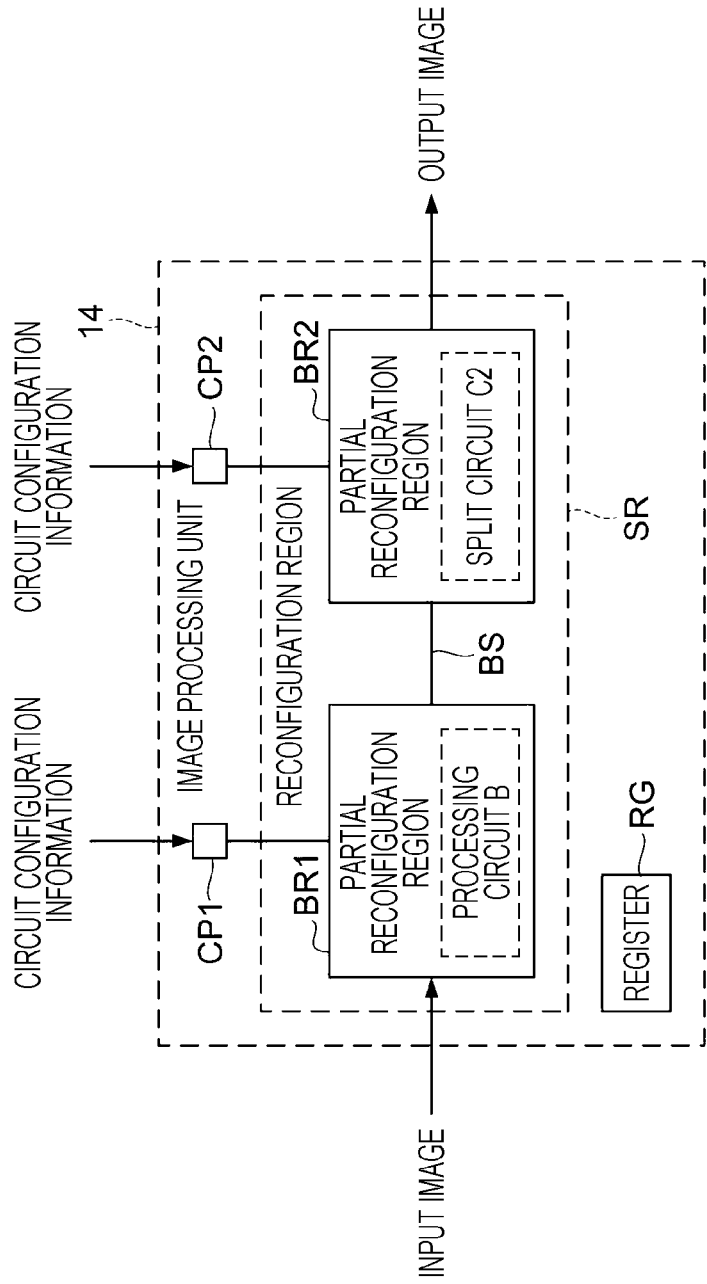
FIG. 6 is a diagram illustrating a state in which a circuit is reconfigured in a reconfiguration region.

With this arrangement, as illustrated in FIG. 6, the image processing unit 14 functions as the processing circuit B and executes the image processing B on the inputted image data, while the split circuit C2 does not execute any processing. The split circuit C2 outputs the data outputted from the processing circuit B as-is, without executing any processing related to the function of the split circuit C2.

Next, in the case where an instruction to execute the image processing C is received together with image data from the higher-layer device (step S100), the CPU 11A acquires the circuit configuration information 21C1 corresponding to the split circuit C1 forming the processing circuit C from the storage unit 13 (step S104). Additionally, the CPU 11A outputs the acquired circuit configuration information 21C1 to the configuration port CP1 (step S106). In the image processing unit 14, reconfiguration processing that reconfigures the partial reconfiguration region BR1 into the split circuit C1 is executed.

Figure 7:
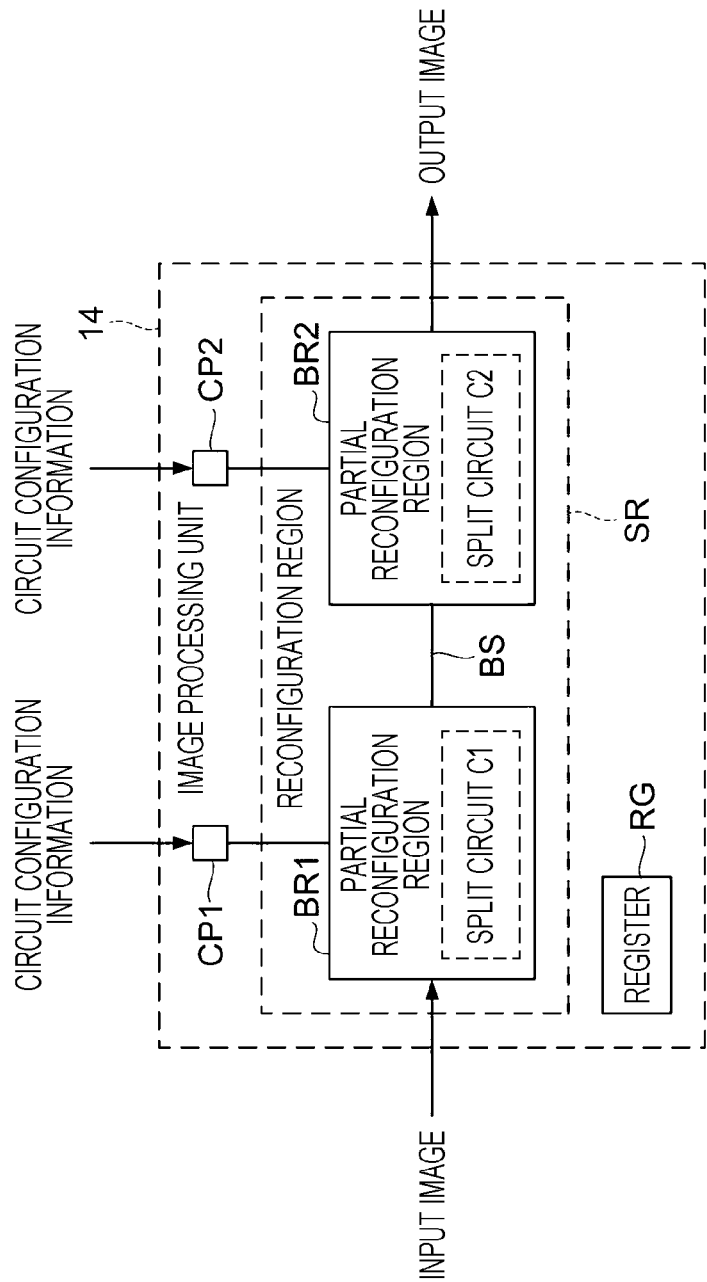
FIG. 7 is a diagram illustrating a state in which a circuit is reconfigured in a reconfiguration region.

With this arrangement, as illustrated in FIG. 7, the image processing unit 14 functions as the processing circuit C including the split circuits C1 and C2, and executes the image processing C on the inputted image data.

In this way, in the present exemplary embodiment, the reconfiguration region SR is divided into the partial reconfiguration regions BR1 and BR2 such that the circuit scale is substantially the same, and circuit reconfiguration in the partial reconfiguration regions BR1 and BR2 is executed in parallel. With this arrangement, the duration of reconfiguration is shortened compared to the case of reconfiguring a circuit only in the single reconfiguration region SR.

Figure 8:
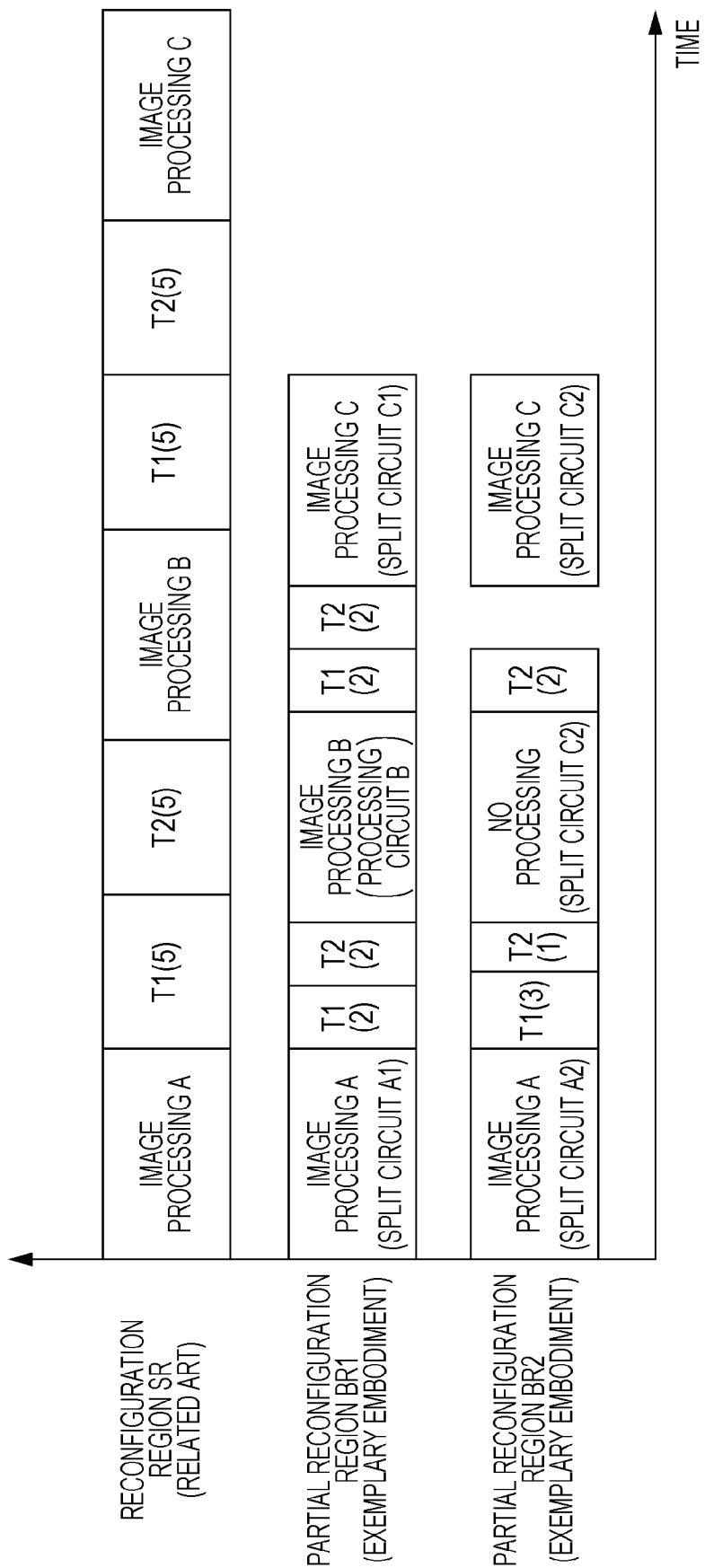
FIG. 8 is a timing chart for explaining the duration of reconfiguration.

FIG. 8 illustrates a timing chart related to reconfiguration and switching image processing in the case of reconfiguring a circuit only in the single reconfiguration region SR like the related art and in the case of reconfiguring circuits in the partial reconfiguration regions BR1 and BR2 in parallel like the present exemplary embodiment. Note that the numerals in parentheses denote time.

Here, to simplify the description, the case of reconfiguring a circuit only in the single reconfiguration region SR like the related art is assumed to have a duration T of 10 (msec). Note that the duration T breaks down into a circuit reconfiguration time T1 of 5 (msec) and a parameter setting time T2 of 5 (msec), for example.

Also, the duration T of reconfiguring a circuit in the partial reconfiguration region BR1 is assumed to be 4 (msec). Note that the duration breaks down into a circuit reconfiguration time T1 of 2 (msec) and a parameter setting time T2 of 2 (msec), for example.

Also, the duration T of reconfiguring a circuit in the partial reconfiguration region BR2 is assumed to be 6 (msec). Note that the duration breaks down into a circuit reconfiguration time T1 of 3 (msec) and a parameter setting time T2 of 3 (msec), for example.

In such a case, when reconfiguring a circuit only in the single reconfiguration region SR like the related art, the duration T when reconfiguring the reconfiguration region SR into the processing circuit B after executing the image processing A in a state with the processing circuit A reconfigured in the reconfiguration region SR is 10 (msec).

In addition, the duration T when reconfiguring the reconfiguration region SR into the processing circuit C after executing the image processing B is also 10 (msec).

In contrast, in the case of executing circuit reconfiguration on the partial reconfiguration regions BR1 and BR2 in parallel like the present exemplary embodiment, the split circuit A1 forming the processing circuit A is reconfigured in the partial reconfiguration region BR1, and the duration T of reconfiguring the processing circuit B in the partial reconfiguration region BR1 after executing the image processing A from a state in which the split circuit A2 is reconfigured in the partial reconfiguration region BR2 is 4 (msec). At this point, the split circuit C2 forming the processing circuit C is reconfigured in the partial reconfiguration region BR2 in advance, and the duration T of the reconfiguration is 6 (msec). Consequently, parameter setting is only executed in 1 (msec). For this reason, the remaining 2 (msec) of parameter setting are carried over into the next reconfiguration process.

Consequently, the duration T of reconfiguration when switching from the image processing A to the image processing B is 4 (msec), which is shorter compared to the 6 (msec) of the related art.

Next, the processing circuit B is reconfigured in the partial reconfiguration region BR1, and the duration T of reconfiguring the split circuit C1 in the partial reconfiguration region BR1 after executing the image processing B in a state with the split circuit C2 reconfigured in the partial reconfiguration region BR2 is 4 (msec). Also, for the partial reconfiguration region BR2, the split circuit C2 is reconfigured in the partial reconfiguration region BR2 prior to the image processing C, but the remaining 2 (msec) of parameter setting is not finished. For this reason, the remaining 2 (msec) of parameter setting are executed.

Consequently, the duration T of reconfiguration when switching from the image processing B to the image processing C is 4 (msec). At this point, in the case where the split circuit C2 is not reconfigured in advance in the partial reconfiguration region BR2, the duration T of reconfiguration in the partial reconfiguration region BR2 is 6 (msec). With this arrangement, when compared to the case where the split circuit C2 is not reconfigured in advance, the duration T of reconfiguration when switching from the image processing B to the image processing C is 2 (msec).

In this way, in the present exemplary embodiment, the reconfiguration of circuits in the partial reconfiguration regions BR1 and BR2 is executed in parallel, thereby shortening the duration of reconfiguration when switching the image processing. As a result, the time until the image processing A to C ends is also shortened.

Second Exemplary Embodiment

Next, a second exemplary embodiment will be described. The configuration of the image processing apparatus 10 is the same as the first exemplary embodiment, and therefore a description is omitted.

In the second exemplary embodiment, a specific example of the processing circuit A that executes the image processing A will be described.

Note that the present exemplary embodiment describes a case in which the processing circuit A performs filter processing as the image processing A, and specifically is a smoothing filter that smooths images as an example, but the filter processing is not limited thereto.

Figure 9:
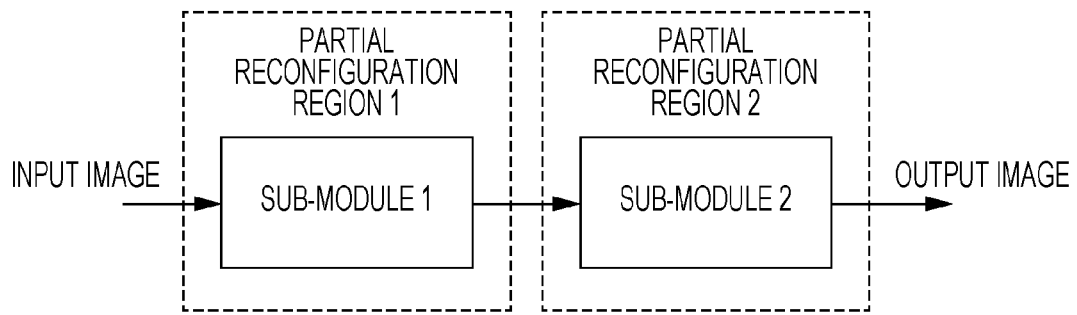
FIG. 9 is a configuration diagram of a reconfiguration region according to an exemplary modification.

In the smoothing filter, a window of N×N pixels (where N is a natural number) is set in an input image to be processed, and coefficients are set with respect to each of the pixels. Additionally, the pixel value of a pixel of interest is computed and output on the basis of the coefficients set in the window. FIG. 9 illustrates a window W of 3×3 pixels and a 3×3 filter matrix F as an example. The filter coefficient "⅑" is set in each cell of the filter matrix F. In this case, the value obtained by performing a multiply-accumulate operation on each of the pixel values of a pixel of interest G1 and neighboring pixels G2 to G9 and the filter coefficients set in each of the cells of the filter matrix F is treated as the pixel value of the pixel of interest G1.

With software-based filter processing, it is sufficient to perform the processing by simply accessing the memory addresses where the neighboring pixels are stored, but in the case of fast processing on a hardware device such as an FPGA, memory access may be a bottleneck in some cases. Consequently, a method of temporarily buffering the input image in a local memory internal to the device is implemented.

Consequently, the processing circuit A that executes the smoothing processing is divided into the two split circuits of the split circuit A1 that buffers the input image in a 3×3 window, and the split circuit A2 that references the buffered 3×3 pixels to perform the smoothing processing.

A circuit that executes smoothing processing is normally organized into a single circuit, but in the present exemplary embodiment, the circuit is deliberately divided into the split circuits A1 and A2, and reconfiguration is executed in parallel. With this arrangement, the duration of reconfiguration is shortened.

Figure 10:
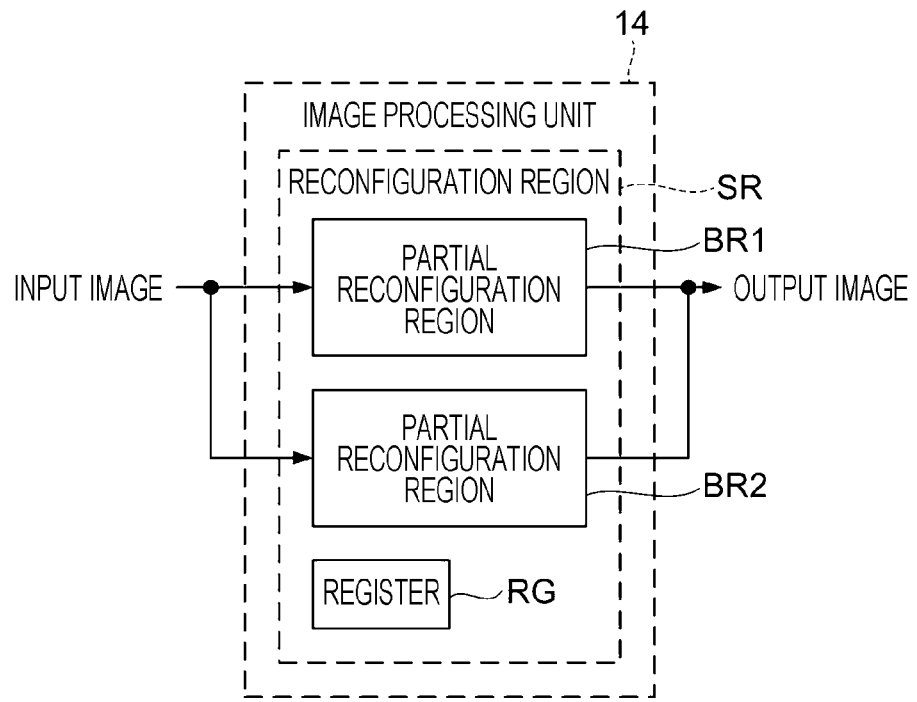
FIG. 10 is a configuration diagram of a reconfiguration region according to an exemplary modification.

Note that although the above describes an example in which the partial reconfiguration regions BR1 and BR2 are connected in series, the partial reconfiguration regions BR1 and BR2 may also be connected in parallel, as illustrated in FIG. 10. Note that in FIG. 10, the configuration ports CP1 and CP2 are omitted from illustration.

In the case of the configuration in FIG. 10, the split circuits A1 and A2 forming the processing circuit A that executes the image processing A are circuits that execute the same processing. In other words, the image processing A is processing that executes the same process in parallel on multiple pixels.

Likewise in such a case, the processing circuit A is normally organized into a single circuit without being divided, but in the present exemplary embodiment, the circuit is deliberately divided into the split circuits A1 and A2, and reconfiguration is executed in parallel. With this arrangement, the duration of reconfiguration is shortened.

Third Exemplary Embodiment

Next, a third exemplary embodiment will be described. The configuration of the image processing apparatus 10 is the same as the first exemplary embodiment, and therefore a description is omitted.

The third exemplary embodiment describes a case in which the circuit configuration information includes identification signs for identifying corresponding processing circuits.

For example, the identification sign "ID-A" is respectively included in the circuit configuration information for the split circuits A1 and A2 forming the processing circuit A. In this case, when reconfiguring the partial reconfiguration regions BR1 and BR2 into the split circuits A1 and A2, the identification sign "ID-A" is stored in internal memory for each of the partial reconfiguration regions BR1 and BR2. Before executing the image processing A by the processing circuit A or the image processing C by the processing circuit C, the CPU 11A allows the processing by the processing circuit if the processing circuit is the same as the processing circuit indicated by the identification sign stored in the internal memory for each of the partial reconfiguration regions BR1 and BR2.

Figure 11:
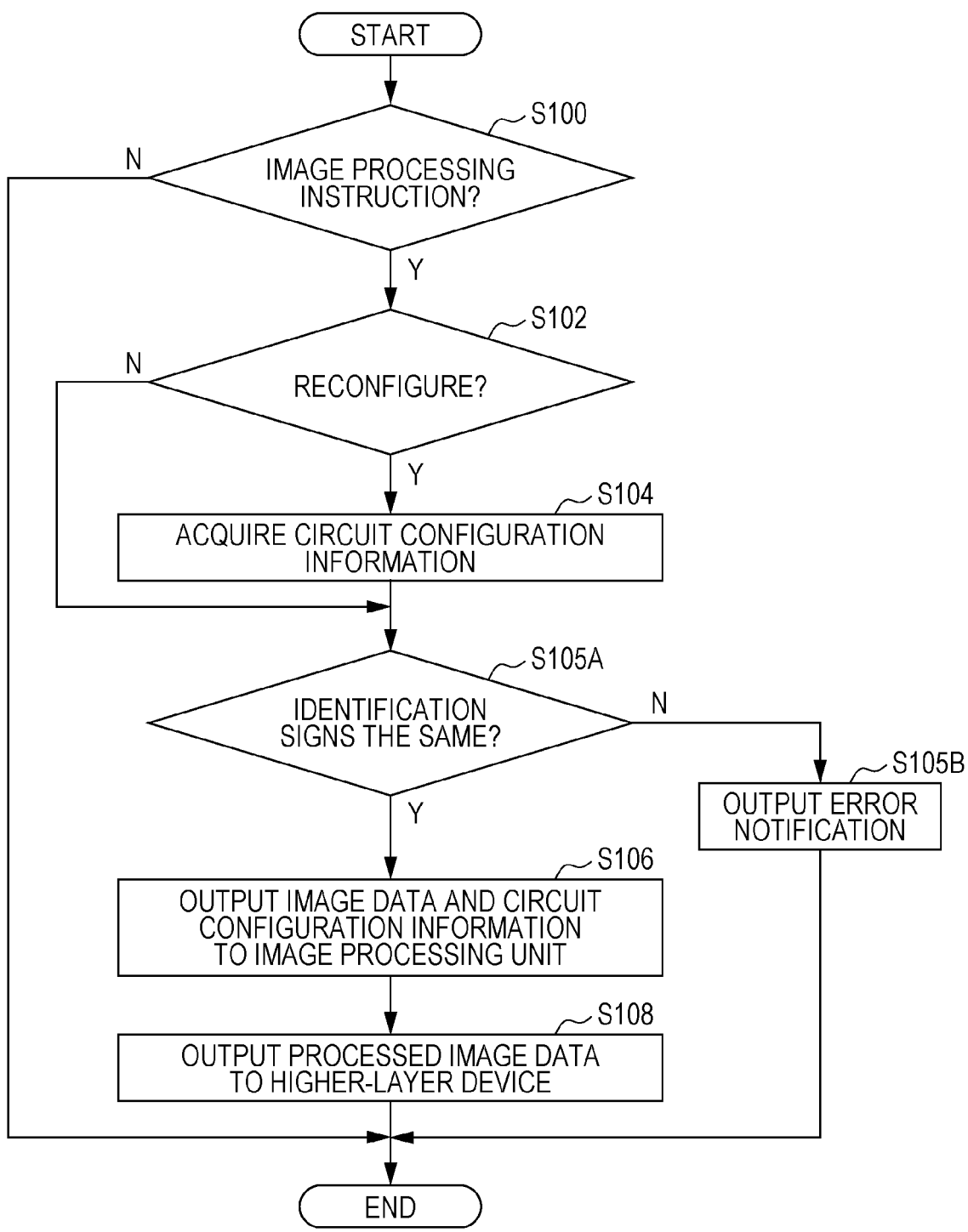
FIG. 11 is a flowchart of a reconfiguration process according to a second exemplary embodiment.

FIG. 11 is a flowchart of a reconfiguration process according to the third exemplary embodiment. Compared to the reconfiguration process described in the first exemplary embodiment and illustrated in FIG. 4, the reconfiguration process illustrated in FIG. 11 differs in that the processes of steps S105A and S105B are added. The other processes are the same as the reconfiguration process illustrated in FIG. 4, and therefore a description is omitted.

Note that the processes of steps S105A and S105B are processes to be performed in the case where the image processing designated for execution is to be executed by a processing circuit that is divided into multiple split circuits, and are unnecessary in the case of executing image processing by a processing circuit that is not divided into multiple split circuits. Consequently, in the case of the example described in the first exemplary embodiment, the processes of steps S105A and S105B are executed when executing the image processing A or C, but the processes of steps S105A and S105B are not executed when executing the image processing B.

In step S105A, the CPU 11A determines whether or not the identification signs included in the circuit configuration information corresponding to each of the partial reconfiguration regions BR1 and BR2 acquired in step S104 are the same. In the case where the identification signs are the same, the flow proceeds to step S106, and in the case where the identification signs are not the same, the flow proceeds to step S105B.

In step S105B, the CPU 11A outputs an error notification to the higher-layer device. In other words, the image processing is not executed. In this way, the image processing is not executed if the identification signs stored in the partial reconfiguration regions BR1 and BR2 are not the same, and consequently, the execution of inappropriate image processing is avoided.

Note that the identification sign may also include a sign that designates a partial reconfiguration region. In this case, the CPU 11A reconfigures the partial reconfiguration region corresponding to the sign designating the partial reconfiguration region into the corresponding split circuit.

For example, the circuit configuration information for the split circuit A1 forming the processing circuit A includes the identification sign "ID-A1", in which the sign "1" designating the partial reconfiguration region BR1 is appended to the identification sign "ID-A". Similarly, the circuit configuration information for the split circuit A2 forming the processing circuit A includes the identification sign "ID-A2", in which the sign "2" designating the partial reconfiguration region BR2 is appended to the identification sign "ID-A".

With this arrangement, the CPU 11A controls the partial reconfiguration region BR1 to be reconfigured into the split circuit A1 and controls the partial reconfiguration region BR2 to be reconfigured into the split circuit A2.

The foregoing exemplary embodiments describe a configuration in which the reconfiguration processing program 20 is installed in the storage unit 13, but are not limited thereto. The reconfiguration processing program 20 according to the exemplary embodiments may also be provided by being recorded onto a computer-readable storage medium. For example, the reconfiguration processing program 20 according to the exemplary embodiments may be provided by being recorded on an optical disc, such as a Compact Disc-Read-Only Memory (CD-ROM) or a Digital Versatile Disc-Read-Only Memory (DVD-ROM), or by being recorded on semiconductor memory, such as Universal Serial Bus (USB) memory or a memory card. Furthermore, the reconfiguration processing program 20 according to an exemplary embodiments may also be acquired from an external device through a communication channel connected to the communication unit 12.

In the exemplary embodiments above, the term "processor" refers to hardware in a broad sense. Examples of the processor include general processors (e.g., CPU: Central Processing Unit) and dedicated processors (e.g., GPU: Graphics Processing Unit, ASIC: Application Specific Integrated Circuit, FPGA: Field Programmable Gate Array, and programmable logic device).

In the exemplary embodiments above, the term "processor" is broad enough to encompass one processor or plural processors in collaboration which are located physically apart from each other but may work cooperatively. The order of operations of the processor is not limited to one described in the exemplary embodiments above, and may be changed.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. An information processing apparatus comprising:

a processor configured to:

acquire a plurality of circuit configuration information corresponding to a plurality of split circuits forming a processing circuit configured to execute a single processing function;

cause reconfiguration processes that reconfigure a plurality of partial reconfiguration regions into the plurality of split circuits corresponding to the acquired plurality of circuit configuration information to be executed in parallel, and in a case where a first subsequent processing circuit configured to execute a first subsequent process to be executed next after the process executed by the processing circuit is reconfigurable in a first partial reconfiguration region from among the plurality of partial reconfiguration regions, cause a reconfiguration process of reconfiguring the first partial reconfiguration region into the first subsequent processing circuit to be executed in parallel with a reconfiguration process that reconfigures a second partial reconfiguration region other than the first partial reconfiguration region into a split circuit among a plurality of split circuits forming a second subsequent processing circuit configured to execute a second subsequent process to be executed next after the first subsequent process.

2. The information processing apparatus according to claim 1, wherein
after executing the first subsequent process, the processor is configured to:
reconfigure the first partial reconfiguration region into an other split circuit among the plurality of split circuits forming the second subsequent processing circuit.

3. The information processing apparatus according to claim 1, wherein
the plurality of partial reconfiguration regions are connected in series, and
in a case of executing the first subsequent process, the processor is configured to:
set a setting such that no processing is executed by the split circuit reconfigured in the second partial reconfiguration region.

4. The information processing apparatus according to claim 2, wherein
the plurality of partial reconfiguration regions are connected in series, and
in a case of executing the first subsequent process, the processor is configured to:
set a setting such that no processing is executed by the split circuit reconfigured in the second partial reconfiguration region.

5. The information processing apparatus according to claim 1, wherein
the plurality of circuit configuration information includes an identification sign to identify a corresponding processing circuit, and
the processor is configured to:
cause the reconfiguration process to be executed in a case where a processing circuit is the same as the processing circuit indicated by the identification sign included in each of the plurality of circuit configuration information.

6. The information processing apparatus according to claim 1, wherein
the plurality of circuit configuration information includes an identification sign to identify a corresponding processing circuit, and
the processor is configured to:
cause the reconfiguration process to be executed in a case where a processing circuit is the same as the processing circuit indicated by the identification sign included in each of the plurality of circuit configuration information.

7. The information processing apparatus according to claim 2, wherein
the plurality of circuit configuration information includes an identification sign to identify a corresponding processing circuit, and
the processor is configured to:
cause the reconfiguration process to be executed in a case where a processing circuit is the same as the processing circuit indicated by the identification sign included in each of the plurality of circuit configuration information.

8. The information processing apparatus according to claim 3, wherein
the plurality of circuit configuration information includes an identification sign to identify a corresponding processing circuit, and
the processor is configured to:
cause the reconfiguration process to be executed in a case where a processing circuit is the same as the processing circuit indicated by the identification sign included in each of the plurality of circuit configuration information.

9. The information processing apparatus according to claim 4, wherein
the plurality of circuit configuration information includes an identification sign to identify a corresponding processing circuit, and
the processor is configured to:
cause the reconfiguration process to be executed in a case where a processing circuit is the same as the processing circuit indicated by the identification sign included in each of the plurality of circuit configuration information.

10. The information processing apparatus according to claim 5, wherein
the identification sign includes a sign designating the partial reconfiguration region, and
the processor is configured to:
reconfigure the partial reconfiguration region corresponding to the sign designating the partial reconfiguration region into a corresponding split circuit.

11. The information processing apparatus according to claim 6, wherein
the identification sign includes a sign designating the partial reconfiguration region, and
the processor is configured to:
reconfigure the partial reconfiguration region corresponding to the sign designating the partial reconfiguration region into a corresponding split circuit.

12. The information processing apparatus according to claim 7, wherein
the identification sign includes a sign designating the partial reconfiguration region, and
the processor is configured to:
reconfigure the partial reconfiguration region corresponding to the sign designating the partial reconfiguration region into a corresponding split circuit.

13. The information processing apparatus according to claim 8, wherein
the identification sign includes a sign designating the partial reconfiguration region, and
the processor is configured to:
reconfigure the partial reconfiguration region corresponding to the sign designating the partial reconfiguration region into a corresponding split circuit.

14. A non-transitory computer readable medium storing a program causing a computer to execute a process for processing information, the process comprising:
acquiring a plurality of circuit configuration information corresponding to at least two or more of a plurality of split circuits forming at least one processing circuit;
causing reconfiguration processes that reconfigure a plurality of partial reconfiguration regions into the plurality of split circuits corresponding to the acquired plurality of circuit configuration information to be executed in parallel on a basis of the acquired plurality of circuit configuration information, and
in a case where a first subsequent processing circuit configured to execute a first subsequent process to be executed next after the process executed by the processing circuit is reconfigurable in a first partial reconfiguration region from among the plurality of partial reconfiguration regions, causing a reconfiguration process of reconfiguring the first partial reconfiguration region into the first subsequent processing circuit to be executed in parallel with a reconfiguration process that reconfigures a second partial reconfiguration region other than the first partial reconfiguration region into a split circuit among a plurality of split circuits forming a second subsequent processing circuit configured to execute a second subsequent process to be executed next after the first subsequent process.

15. A programmable logic circuit comprising:
the information processing apparatus according to claim 1; and
a reconfiguration region including a plurality of partial reconfiguration regions reconfigured by the information processing apparatus.

16. The programmable logic circuit according to claim 15, wherein
each of the plurality of partial reconfiguration regions includes a maximum number of resource circuits for each type of resource circuit included in a plurality of circuits that have a possibility of being reconfigured in the plurality of partial reconfiguration regions.

17. The programmable logic circuit according to claim 16, wherein
the numbers of resource circuits included in each of the plurality of partial reconfiguration regions are substantially the same.

18. The programmable logic circuit according to claim 15, wherein
the plurality of partial reconfiguration regions are connected in series through a bus, and a bus width of the bus is a maximum bus width from among bus widths demanded by a plurality of split circuits that have a possibility of being reconfigured in the plurality of partial reconfiguration regions.

19. The programmable logic circuit according to claim 15, wherein
the plurality of partial reconfiguration regions are connected in parallel, and
the plurality of split circuits are circuits configured to execute a same process.

* * * * *